(12) United States Patent
Dmytriw et al.

(10) Patent No.: US 7,772,835 B2
(45) Date of Patent: Aug. 10, 2010

(54) AMR ARRAY MAGNETIC DESIGN FOR IMPROVED SENSOR FLEXIBILITY AND IMPROVED AIR GAP PERFORMANCE

(75) Inventors: Anthony Dmytriw, DeKalb, IL (US); Kent E. Van Ostrand, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/139,645

(22) Filed: Jun. 16, 2008

(65) Prior Publication Data

US 2009/0309580 A1   Dec. 17, 2009

(51) Int. Cl.
G01R 33/02    (2006.01)
G01R 33/06    (2006.01)

(52) U.S. Cl. .................................. 324/207.21; 324/252
(58) Field of Classification Search ............ 324/207.25, 324/207.21, 252
See application file for complete search history.

(56) References Cited

U.S. PATENT DOCUMENTS

| | | | | |
|---|---|---|---|---|
| 6,097,183 | A | 8/2000 | Goetz et al. | 324/207.12 |
| 6,806,702 | B2 * | 10/2004 | Lamb et al. | 324/207.25 |
| 6,823,725 | B2 * | 11/2004 | Lohberg | 73/114.01 |
| 7,030,604 | B1 | 4/2006 | Dmytriw et al. | 324/207.12 |
| 7,173,414 | B2 | 2/2007 | Ricks et al. | 324/207.25 |

FOREIGN PATENT DOCUMENTS

JP         6-137809 A        5/1994
KR     2007-0114314 A     11/2007

OTHER PUBLICATIONS

Written Opinion and International Search Report from corresponding PCT Application Serial No. PCT/US2009/047294, mailed Jan. 22, 2010, 6 pages.

* cited by examiner

*Primary Examiner*—Reena Aurora
(74) *Attorney, Agent, or Firm*—Shumaker & Sieffert, P.A.

(57) ABSTRACT

An AMR array magnetic position sensing system for improved sensor flexibility and improved air gap performance is disclosed. A pair of magnets can be enclosed in a magnet carrier that moves along a path and located above an array of AMR position sensors. The magnets are generally magnetized through the length of the magnets, and the magnets are positioned in the carrier such that an angle between the magnets exists in a manner similar to an angle made by AMR runners on a surface of the AMR positions sensors to create magnetic flux lines thereof. The AMR position sensors come into contact with the uniform magnetic flux lines to sense a change in linear and angular position associated with the magnet carrier. The output signal generated by the AMR position sensors have less susceptibility to variations in air gap as the angles of the magnetic flux lines generated by the magnets do note change with respect to air gap variation.

20 Claims, 6 Drawing Sheets

AMR ARRAY MAGNETIC DESIGN FOR IMPROVED SENSOR FLEXIBILITY AND IMPROVED AIR GAP PERFORMANCE

TECHNICAL FIELD

Embodiments are generally related to sensor methods and systems. Embodiments are also related to magnetic sensors. Embodiments are additionally related to Anisotropic Magnetoresistive (AMR) array magnetic designs for improved sensor flexibility and improved air gap performance.

BACKGROUND OF THE INVENTION

Magnetoresistive (MR) technology can be utilized in a variety of commercial, consumer, and industrial detection applications. Anisotropic Magnetoresistance (AMR) is the property of a material in which the electrical resistance can change depending on the angle between the direction of electrical current and orientation of magnetic field is observed. AMR array position sensors yield a very accurate signal with respect to the position of a magnet. In conventional MR systems, for example, a device may be provided for determining the position of a member movable along a path. The device includes a magnet attached to the movable member and an array of AMR sensors located adjacent the path. As the magnet approaches, passes, and moves away from a sensor, the sensor provides a varying output signal, which can be represented by a single characteristic curve that is representative of any of the sensors.

To determine the position of the movable member, the sensors can be electronically scanned and data selected from a group of sensors having an output that indicates the relative proximity to the magnet. A curve-fitting algorithm can then be utilized to determine a best fit of the data to the characteristic curve. The position of the magnet and therefore the movable member may be determined by placing the characteristic curve along a position axis.

FIGS. 1A and 1B illustrates a prior art AMR position sensing system 100. The AMR position sensing system 100 generally includes a magnet 110 and an array of AMR position sensors 130 to sense the relative position of the magnet 110 within the array of AMR position sensors 130. The magnet 110 must be positioned such that the magnetic flux lines as indicated by arrow 120 of the magnet 110 are in the same plane of the AMR position sensors 130. The magnet 110 generates magnetic flux lines 120 while moving in the direction as indicated by arrow 140. If the air gap 160, the distance between the magnet 110 and the AMR position sensors 130, is changed significantly after calibration, the performance of the AMR position sensors 130 also changes. FIG. 1B illustrates the magnetic flux lines 120 in different direction when the magnet moves in the same plane of the AMR position sensors 130 in the direction as indicated by arrow 140.

FIG. 2 illustrates two AMR bridge signals 200 and 210 obtained from the prior art AMR position sensing system 100 as the magnet 110 moves and passes the AMR position sensors 130. The bridge signals 200 and 210 can be generated as the magnet 110 moves and passes through the AMR position sensors 130. The peaks 220 and 230 correspond to the position when the magnetic flux lines 120 are perpendicular to half the AMR sensor runners 135 and parallel to the others in the AMR position sensors 130. The position at which the magnetic flux lines 120 are parallel or perpendicular to the AMR sensor runners 135 changes with respect to the changes in the air gap 160, which in turn changes the bridge signal 200 generated from the AMR position sensors 130 respect of position. The problem associated with such prior art position sensing system 100 is that as the distance between the AMR position sensors 130 and the magnet 110 changes, the signal changes decreasing repeatability of the sensor. Hence, the overall performance of the AMR position sensors decreases.

Based on the foregoing, it is believed that a need exists for an improved AMR array magnetic design for improved sensor flexibility and improved air gap performance as described in greater detail herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for improved sensor methods and systems.

It is another aspect of the present invention to provide an improved AMR position sensing system.

It is a further aspect of the present invention to provide an improved AMR array magnetic position sensing system for improved sensor flexibility and improved air gap performance.

The aforementioned aspects and other objectives and advantages can now be achieved as described herein. An AMR array magnetic position sensing system for improved sensor flexibility and improved air gap performance is disclosed. A pair of magnets can be enclosed in a magnet carrier that moves along a path and located above an array of AMR position sensors. The magnets are generally magnetized through the length of the magnets. The AMR position sensors can come into contact with the uniform magnetic flux lines to sense a change in linear and angular position associated with the magnet carrier. The output signal generated by the AMR position sensors have less susceptibility to variations in air gap as the angles of the magnetic flux lines generated by the magnets are not changing with air gap variation.

The AMR position sensors can be located external to the two magnets, such that the sensor comes into contact with the uniform magnetic flux lines to sense a change in angular and linear position associated with the rotatable base. The AMR array position sensors can sense linear and rotary position of the magnets while the magnet carrier is moving in the linear or rotary magnetized direction to efficiently sense the position of the moving magnet carrier. Such an AMR array magnetic sensor design can improve the performance of the AMR array sensors with respect to changes of air gap.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1A:
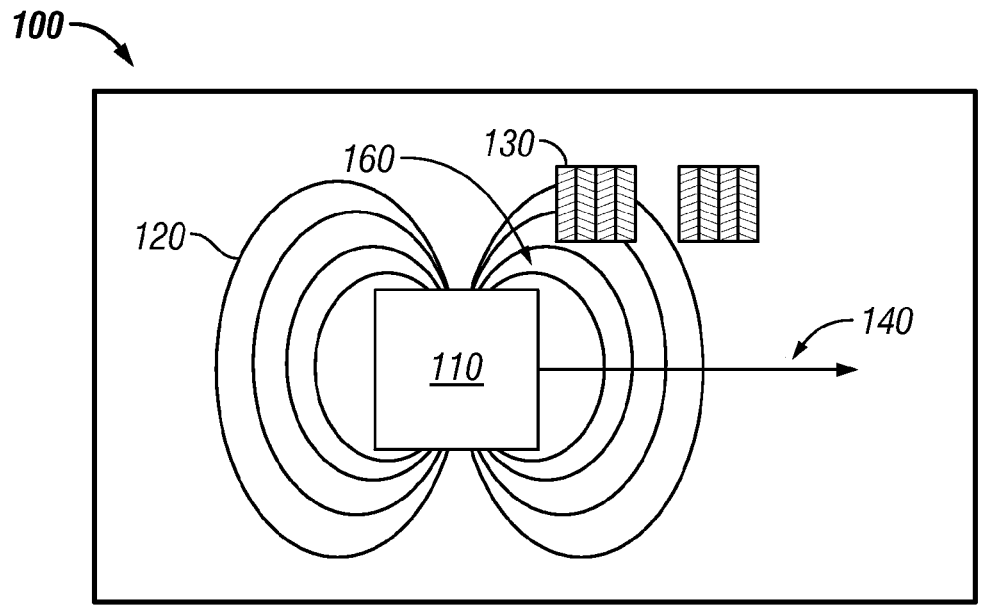
FIGS. 1A and 1B illustrates a prior art AMR position sensing system.
Figure 1B:
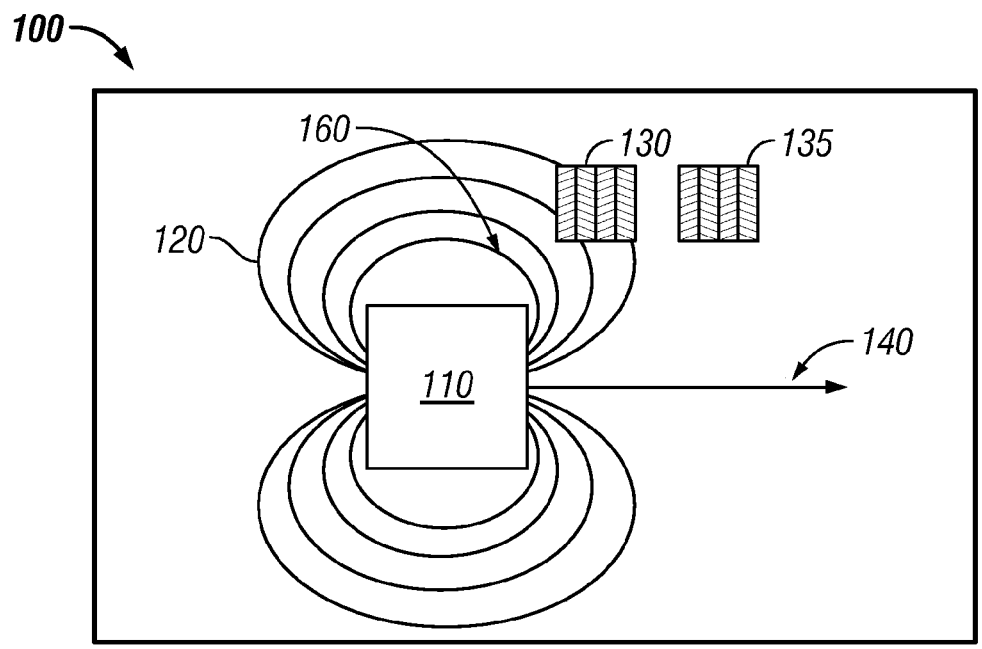
Figure 2:
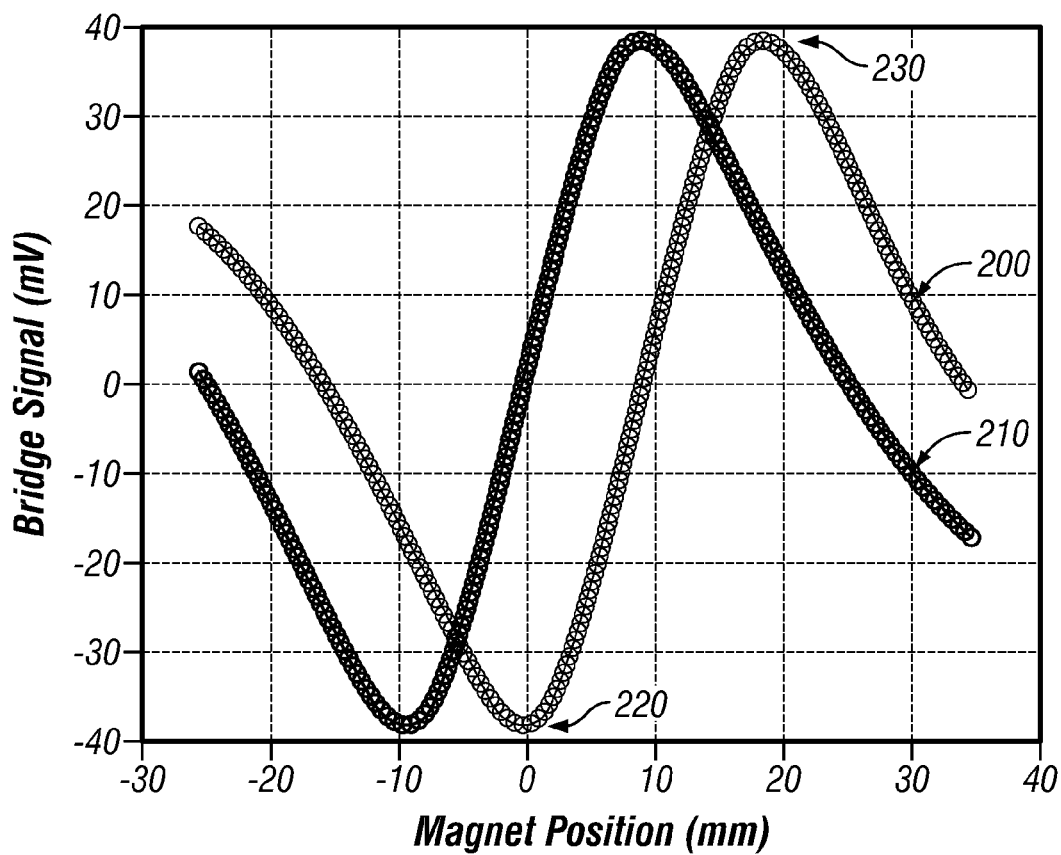
FIG. 2 illustrates a graphical representation of the bridge signals obtained from the prior art AMR position sensing system.
Figure 3:
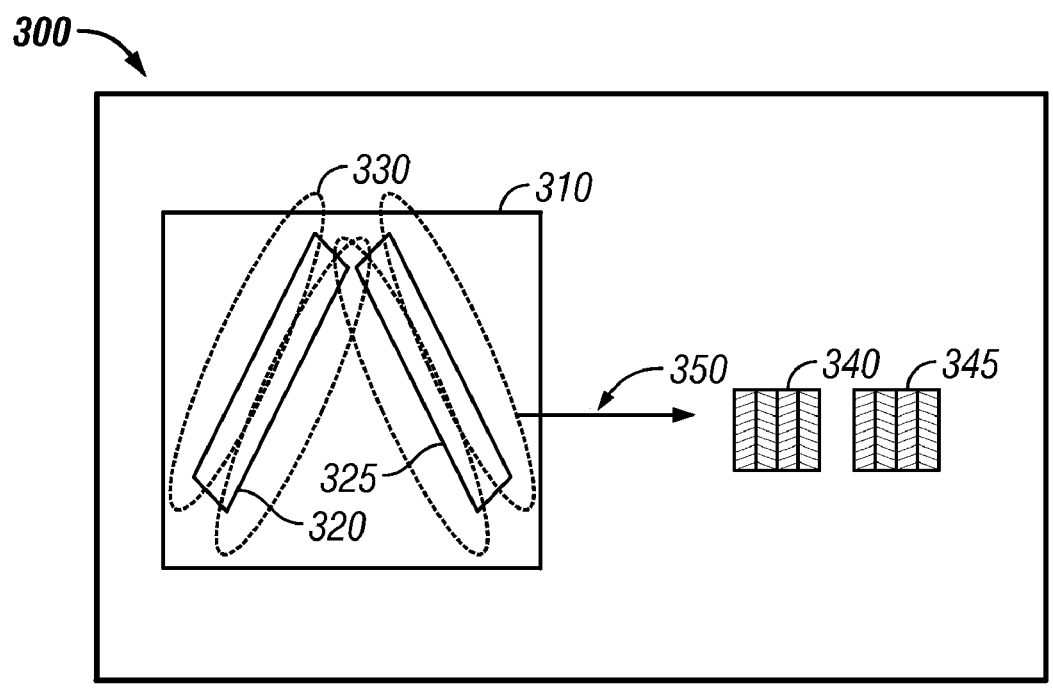
FIG. 3 illustrates a perspective view of an AMR position sensing system, in accordance with a preferred embodiment.

FIG. 3 illustrates a perspective view of an AMR position sensing system 300, in accordance with a preferred embodiment. The AMR position sensing system 300 generally includes a magnet carrier 310, which holds two magnets 320 and 325. The magnets 320 and 325 are generally magnetized through the length of the magnets to create uniform magnetic flux lines 330 thereof. The AMR position sensing system 300 also includes an array of AMR position sensors 340 with AMR runners 345 located respectively external to first and second magnets 320 and 325. The magnets 320 and 325 enclosed in the magnet carrier 310 moves along a path 350 and generally located centrally above the array of AMR position sensors 340. Note that as utilized herein, the term "above" can refer to both vertical and horizontal positions. The AMR position sensors 340 thus come into contact with the uniform magnetic flux lines 330 to sense a change in position associated with the magnet carrier 310.

The magnetic flux lines 330 are depicted in FIG. 3 between the magnets 320 and 325. The AMR position sensors 340 can therefore be configured as a single anisotropic magnetoresistive (AMR) permalloy sensing bridge (not shown) configured from four thin-film resistors located at a fixed point from magnets 320 and 325 to provide a sinusoidal voltage signal as the resultant flux density vector varies with magnet travel. A magnet travel position can then be determined from the sinusoidal signal voltage curve. The AMR effect changes a resistance of a magneto-resistive effect element in proportion to a square of a cosine of an angle formed between the magnetization of the element and the direction in which a sense current that flows through the element is conducted. AMR occurs in certain ferrous materials such as permalloy and can be applied as a thin film to become a resistive element.

Figure 4:
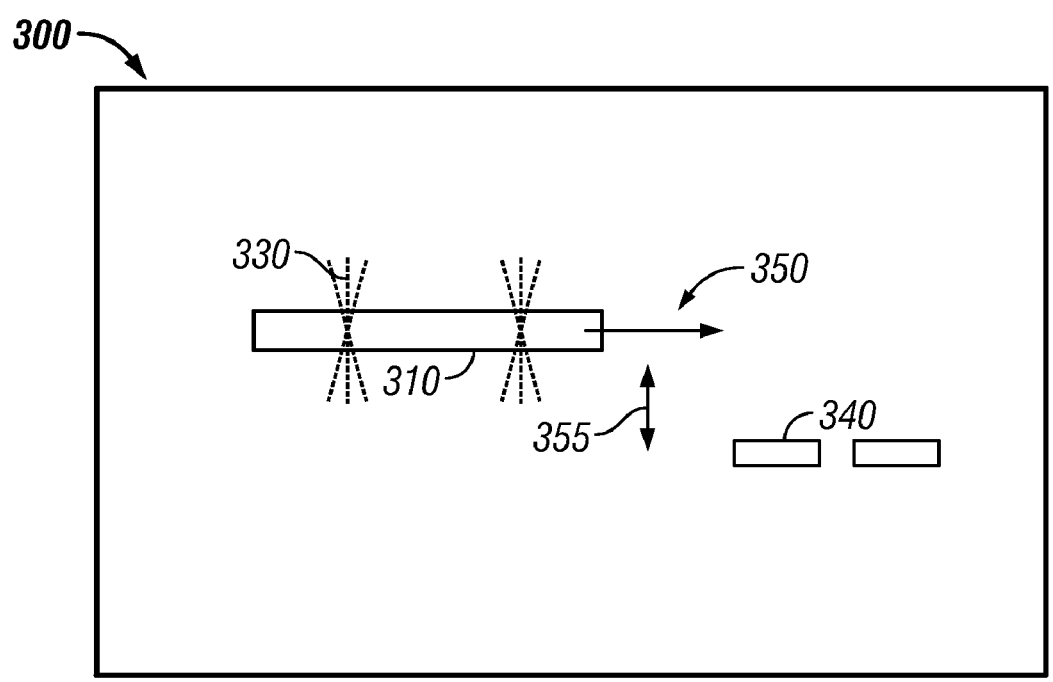
FIG. 4 illustrates a top view of the AMR position sensing system, in accordance with a preferred embodiment.

FIG. 4 illustrates a top view of the AMR position sensing system 300, in accordance with the preferred embodiment. Note that in FIGS. 3-4, identical or similar parts are generally indicated by identical reference numerals. The AMR position sensing system 300 generally includes the magnet carrier 310 and the array of AMR position sensors 340. The AMR position sensors 340 comes into contact with the uniform magnetic flux lines 330 to sense a change in linear and angular position associated with the magnet carrier 310. The array of AMR position sensors 340 can provide output signals as the magnet carrier 310 passes and moves away from each of the AMR sensors in the array 340. The output signals have less susceptibility to variations in air gap 355 between the magnet carrier 310 and the AMR position sensors 340 as the angles of the flux lines 330 are not changing with air gap variation.

Figure 5:
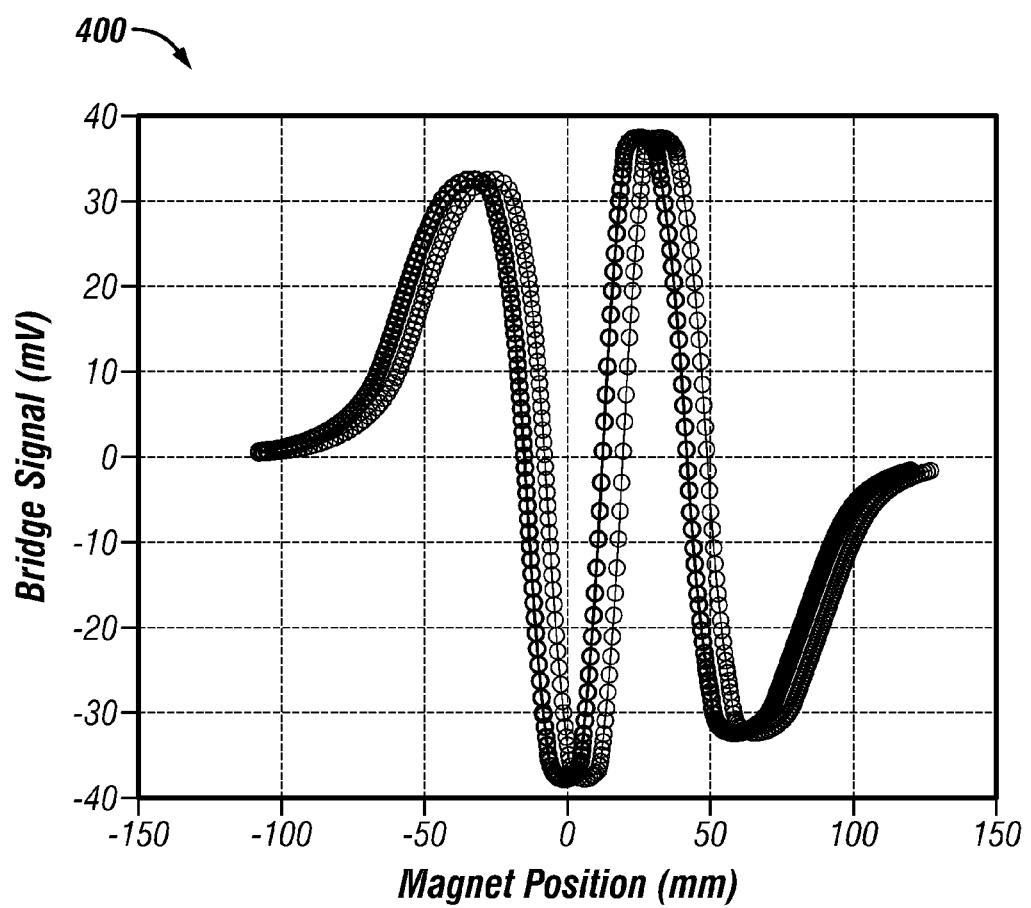
FIG. 5 illustrates a graphical representation of the bridge signals obtained from the AMR position sensing system, in accordance with a preferred embodiment.

FIG. 5 illustrates a graphical representation of two bridge signals 400 obtained from the AMR position sensing system 300, in accordance with the preferred embodiment. The bridge signals 400 can be generated as the magnets 320 and 325 moves and passes over the AMR position sensors 340. The bridge signals 400 comprise AMR sensor signals corresponding to the magnet carrier 310 position moving in the linear direction 350. The bridge signals 400 have less susceptibility to variations in air gap 355 as the angles of the flux lines 330 are not changing with the variation of the air gap 355.

Figure 6:
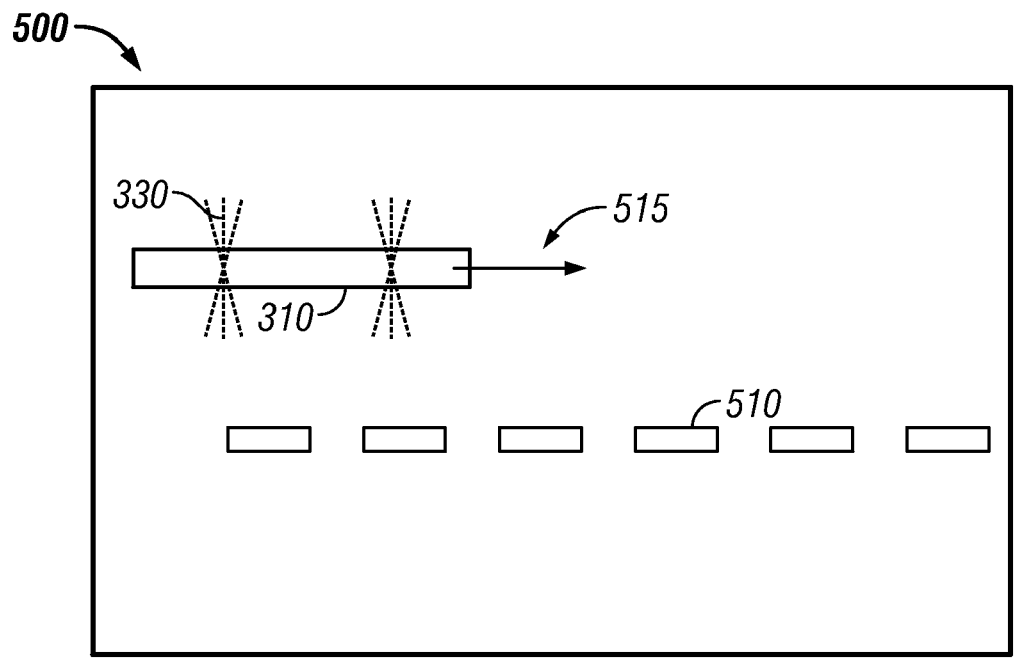
FIG. 6 illustrates a perspective view of the AMR position sensing system for linear position sensing, in accordance with a preferred embodiment.

FIG. 6 illustrates a perspective view of an AMR position sensing system 500 for linear position sensing, in accordance with a preferred embodiment. The AMR position sensors 340 can be positioned linearly and can be located below the two magnets 320 and 325 associated with the magnet carrier 310, such that the sensors 510 comes into contact with the magnetic flux lines 330 to sense a change in linear position associated with the magnet carrier 310. The linear array of AMR position sensors 510 can be utilized to sense the position of the magnet carrier 310 while moving in the linear direction 515.

Figure 7:
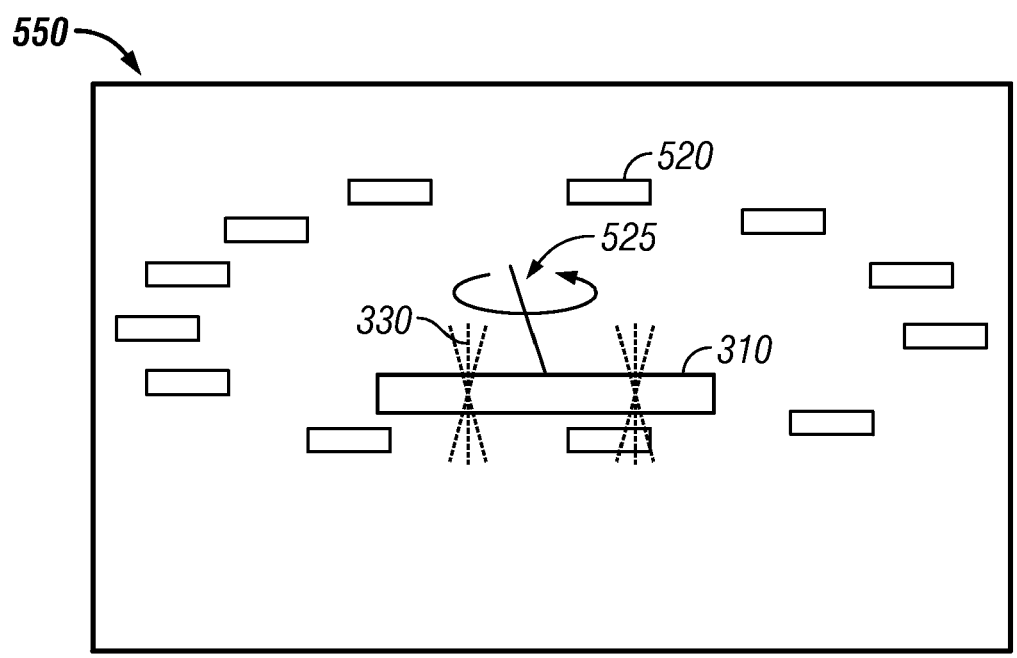
FIG. 7 illustrates a perspective view of the AMR position sensing system for rotary position sensing, in accordance with a preferred embodiment.

FIG. 7 illustrates a perspective view of the AMR position sensing system 550 for rotary position sensing, in accordance with a preferred embodiment. The AMR rotary position sensors 520 can be located below the two magnets 320 and 325 associated with the magnet carrier 310, such that the sensors 520 comes into contact with the uniform magnetic field 330 to sense a change in rotary position associated with the magnet carrier 310. The rotary array of AMR position sensors 520 can be utilized to sense the position of the magnet carrier 310 while moving in the rotary magnetized direction 525.

Figure 8:
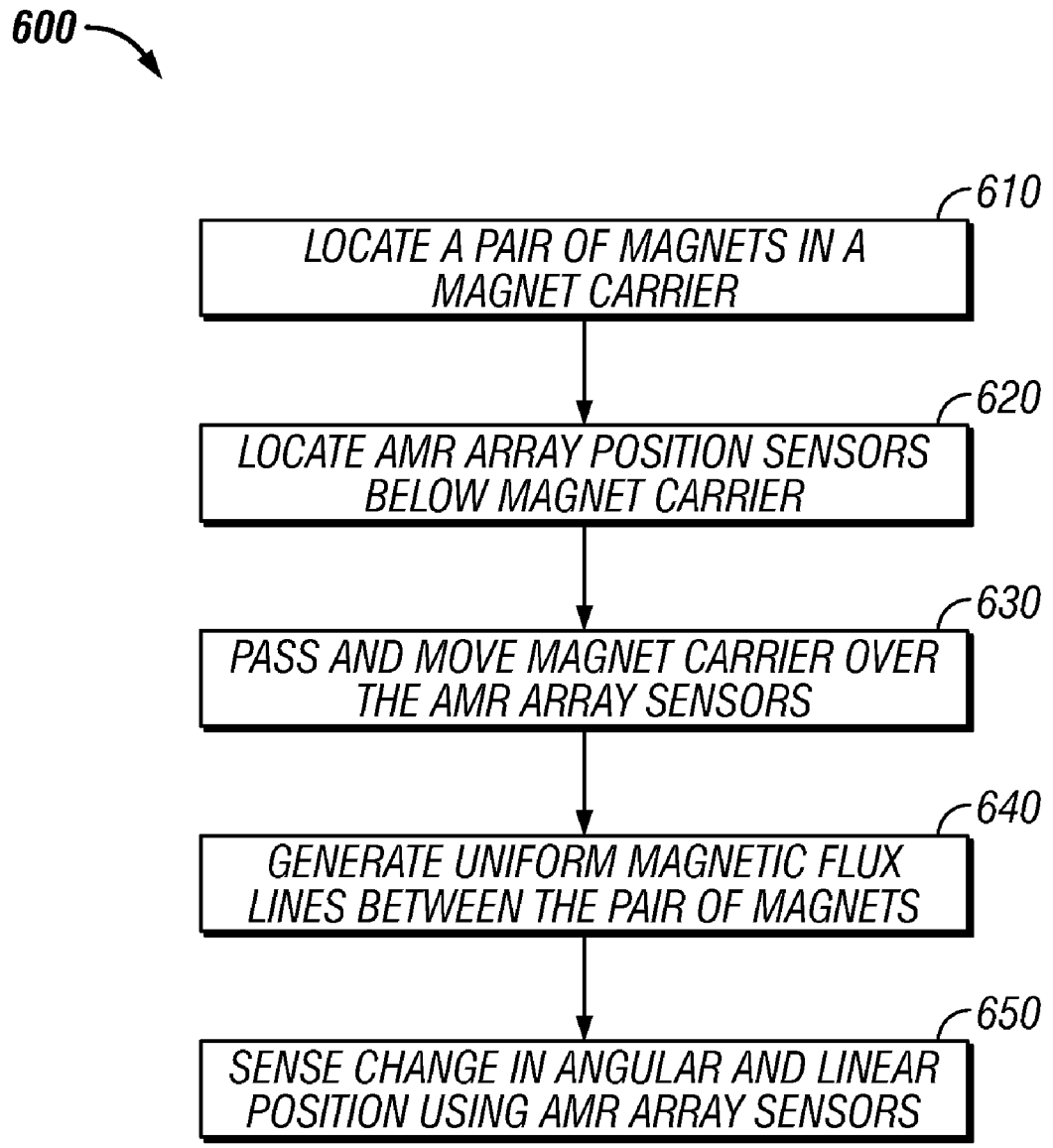
FIG. 8 illustrates a detailed flow chart of operations illustrating logical operational steps of a method for designing the AMR position sensing system for improved sensor flexibility and improved air gap performance, which can be implemented in accordance with a preferred embodiment.

FIG. 8 illustrates a detailed flow chart of operations illustrating logical operational steps of a method 600 for designing the AMR position sensing system 300 for improved sensor flexibility and improved air gap performance, which can be implemented in accordance with a preferred embodiment. A pair of magnets 320 and 325 can be located in a magnet carrier 310, as illustrated at block 610. Next, as depicted at block 620, the AMR position sensors 340 can be located below the magnet carrier 310. The magnet carrier 310 can then be moved and passed over the AMR array sensors 340, as shown at block 630. Thereafter, magnetic flux lines 330 between the pair of magnets 320 and 325 can be generated, as illustrated at block 640.

The change in angular and/or linear position can then be sensed utilizing the AMR position sensors 340, as illustrated in block 650, and the signals generated by the sensors 340 have less susceptibility to variations in air gap 355 as the angles of the flux lines 330 are not changing with air gap variation. It is believed that by utilizing the AMR position sensing system 300 described herein, the sensor flexibility can be increased significantly by placing the magnet carrier 310 over the AMR position sensors 340. The performance of the AMR position sensors 340 with respect to changes of air gap 355 can also be improved.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for designing an AMR position sensing system comprising;
    locating two magnets in a magnet carrier, wherein said two magnets are magnetized through a length of said two magnets and wherein said magnets are positioned in said magnet carrier; and
    placing a plurality of AMR position sensors below said magnet carrier between said two magnets, wherein said plurality of AMR position sensors comes into contact with magnetic flux lines in order to generate signals with less susceptibility to variations in an air gap, such that angles of said magnetic flux lines do not change with respect to air gap variation, and wherein an angle between said two magnets is analogous to an angle formed by an AMR runner on a surface of said plurality of AMR positions sensors.

2. The method of claim 1 further comprising;
    detecting a change in a linear position associated with said magnetic carrier utilizing said plurality of AMR position sensors.

3. The method of claim 2 wherein said plurality of AMR position sensors comprises an array of magnetoresistive-sensing components.

4. The method of claim 1 further comprising:
    detecting a change in an angular position associated with said magnetic carrier utilizing said plurality of AMR position sensors.

5. The method of claim 4 wherein said plurality of AMR position sensors comprises an array of magnetoresistive-sensing components.

6. The method of claim 1 wherein said plurality of AMR position sensors comprises an array of magnetoresistive-sensing components.

7. An AMR position sensing system comprising;
    two magnets located in a magnet carrier, wherein said two magnets are magnetized through a length of said two magnets and wherein said magnets are positioned in said magnet carrier; and
    a plurality of AMR position sensors positioned below said magnet carrier between said two magnets, wherein said plurality of AMR position sensors comes into contact with magnetic flux lines in order to generate signals with less susceptibility to variations in an air gap, such that angles of said magnetic flux lines do not change with respect to air gap variation, and wherein an angle between said two magnets is analogous to an angle formed by an AMR runner on a surface of said plurality of AMR positions sensors.

8. The system of claim 7 wherein said plurality of AMR position sensors detects a change in a linear position associated with said magnetic carrier.

9. The system of claim 8 wherein said plurality of AMR position sensors comprises an array of magnetoresistive-sensing components.

10. The system of claim 7 wherein said plurality of AMR position sensors detects a change in an angular position associated with said magnetic carrier.

11. The system of claim 10 wherein said plurality of AMR position sensors comprises an array of magnetoresistive-sensing components.

12. The system of claim 7 wherein said plurality of AMR position sensors comprises an array of magnetoresistive-sensing components.

13. The system of claim 7 wherein a length of each of said two magnets is greater than dimensions of said plurality of AMR position sensors.

14. An AMR position sensing system comprising;
    two magnets located in a magnet carrier, wherein said two magnets are magnetized through a length of said two magnets and wherein said magnets are positioned in said magnet carrier; and
    a plurality of AMR position sensors comprising an array of magnetoresistive-sensing components, said plurality of AMR position sensors located below said magnet carrier between said two magnets, wherein said plurality of AMR position sensors comes into contact with magnetic flux lines in order to generate signals with less susceptibility to variations in an air gap, such that angles of said magnetic flux lines do not change with respect to air gap variation, and wherein an angle between said two magnets is analogous to an angle formed by an AMR runner on a surface of said plurality of AMR positions sensors.

15. The system of claim 14 wherein said plurality of AMR position sensors detects a change in a linear position associated with said magnetic carrier.

16. The system of claim 14 wherein said plurality of AMR position sensors detects a change in an angular position associated with said magnetic carrier.

17. The system of claim 14 wherein each AMR position sensor among said plurality of AMR position sensors comprises a rotary position sensor configured in a rotary array of AMR position sensors.

18. The system of claim 17 wherein said rotary array of AMR position sensors detects a position of said magnet carrier while moving in a rotary magnetized direction.

19. The system of claim 14 wherein said two magnets comprise a first magnet and a second magnet located at a distance from one another to thereby generate said magnetic flux lines between said two magnets.

20. The system of claim 14 wherein a length of each of said two magnets is greater than dimensions of said plurality of AMR position sensors.

* * * * *